United States Patent [19]

Hirano

[11] Patent Number: 4,509,038

[45] Date of Patent: Apr. 2, 1985

[54] CODE-CONVERTING SYSTEM FOR BAND COMPRESSION OF DIGITAL SIGNALS

[75] Inventor: Akira Hirano, Tokyo, Japan

[73] Assignee: Nippon Electric Co., Ltd., Tokyo, Japan

[21] Appl. No.: 467,953

[22] Filed: Feb. 18, 1983

Related U.S. Application Data

[63] Continuation-in-part of Ser. No. 099,501, Dec. 3, 1979, abandoned, which is a continuation of Ser. No. 918,102, Jun. 22, 1978, abandoned.

[30] Foreign Application Priority Data

Jun. 27, 1977 [JP] Japan .................................. 52-76978

[51] Int. Cl.³ ............................................ H03K 13/24
[52] U.S. Cl. ................................ 340/347 DD; 235/310
[58] Field of Search ................. 340/347 DD; 235/310

[56] References Cited

U.S. PATENT DOCUMENTS 3,185,823  5/1965  Ellersick ..................... 340/347 DD
3,675,211  7/1972  Raviv .......................... 340/347 DD
4,177,456 12/1979  Fukinuki ..................... 340/347 DD

OTHER PUBLICATIONS

Candy "The Bell System Technical Journal" vol. 50, No. 6, Jul.-Aug. 1971, pp. 1889–1917.
Fano "Transmission of Information–A Statistical Theory of Communication" The MIT Press, pp. 62–81, May 1966.
Atrubin "IBM Technical Disclosure Bulletin" vol. 14, No. 3, Aug. 1971, pp. 874–876.
TTL Bipolar Memory & Interface Circuits, 1st Ed. Texas Instruments.

Primary Examiner—Charles D. Miller
Attorney, Agent, or Firm—Laff, Whitesel, Conte & Saret

[57] ABSTRACT

A television system (for example) may transmit a stream of signals in the form of successive binary words. The signal transmission channel may be used much more efficiently if these binary words are compressed by a reduction of the signal bits before transmission or expanded after transmission in order to reconstitute the original signal. Regardless of why the signals are compressed, the invention improves the transmission quality by sending a combination of fixed length and variable length binary words. This is done by providing a fixed length signal converter in parallel with a variable length signal converter. A decision-making circuit separates the successive binary words responsive to logical decision-making rules relating to an average length word. A selector switch selects between the outputs of the two converters responsive to the logical decisions. Stated another way, one converter is used for signal words which are longer than average and the other converter is used for signal words which are shorter than average so that the combination causes all signals to have an average number of bits which is much less than the original number of bits.

3 Claims, 29 Drawing Figures

| INPUT ADDRESS | OUTPUT CODE | | | INPUT DIGITAL SIGNAL |
|---|---|---|---|---|
| | FIXED LENGTH CODE | DUMMY CODE | CODE-LENGTH INDICATIONS CODE | |
| 1 1 1 1 1 1 | 0 0 0 0 0 0 (F*) | X X X X X X | 0 1 1 0 | $I_1$ |
| 1 1 1 1 1 0 | 0 0 0 0 0 1 (F*) | X X X X X X | 0 1 1 0 | $I_3$ |
| 1 1 1 1 0 0 | 0 0 0 0 1 1 (F*) | X X X X X X | 0 1 1 0 | $I_4$ |
| 1 1 1 0 1 0 | 0 0 0 1 0 1 (F) | X X X X X X | 0 1 1 0 | $I_6$ |
| 1 1 0 1 1 0 | 0 0 1 0 0 1 (F) | X X X X X X | 0 1 1 0 | $I_8$ |
| 1 1 0 0 0 0 | 0 0 1 1 1 1 (F) | X X X X X X | 0 1 1 0 | $I_{10}$ |
| 0 0 0 0 0 0 | 1 1 1 1 1 1 (F) | X X X X X X | 0 1 1 0 | $I_{12}$ |

FIG. 6

| INPUT ADDRESS | OUTPUT CODE | | INPUT DIGITAL SIGNAL |
|---|---|---|---|
| | VARIABLE LENGTH CODE ($V_N$ or $V_N$*) / DUMMY CODE (XX=X) | CODE-LENGTH INDICATION CODE | |
| 1 1 1 1 1 1 | 1 ($V_1$) \| X X X X X X X X X X X | 0 0 0 1 | $I_1$ |
| 1 1 1 1 1 0 | 0 1 0 ($V_3$) \| X X X X X X X X X | 0 0 1 1 | $I_3$ |
| 1 1 1 1 0 0 | 0 0 1 0 ($V_4$) \| X X X X X X X X | 0 1 0 0 | $I_4$ |
| 1 1 1 0 1 0 | 0 0 0 1 0 0 ($V_6$) \| X X X X X X | 0 1 1 0 | $I_6$ |
| 1 1 0 1 1 0 | 0 0 0 0 1 0 0 0 ($V_8$*) \| X X X X | 1 0 0 0 | $I_8$ |
| 1 1 0 0 0 0 | 0 0 0 0 0 1 0 0 0 0 ($V_{10}$*) \| X X | 1 0 1 0 | $I_{10}$ |
| 0 0 0 0 0 0 | 0 0 0 0 0 0 1 1 1 1 1 1 ($V_{12}$*) | 1 1 0 0 | $I_{12}$ |

FIG. 7

| INPUT ADDRESS | | INPUT DIGITAL SIGNAL | OUTPUT | DECISION RULE |
|---|---|---|---|---|
| OUTPUT FROM GATE 30 | INPUT FROM TERMINAL 12 | | | |
| 0 | 1 1 1 1 1 1 | $I_1$ | 1 | |
| 0 | 1 1 1 1 1 0 | $I_3$ | 1 | |
| 0 | 1 1 1 1 0 0 | $I_4$ | 1 | 1 |
| 0 | 1 1 1 0 1 0 | $I_6$ | 0 | |
| 0 | 1 1 0 1 1 0 | $I_8$ | 0 | |
| 0 | 1 1 0 0 0 0 | $I_{10}$ | 0 | |
| 0 | 0 0 0 0 0 0 | $I_{12}$ | 0 | |
| 1 | 1 1 1 1 1 1 | $I_1$ | 1 | |
| 1 | 1 1 1 1 1 0 | $I_3$ | 1 | |
| 1 | 1 1 1 1 1 0 | $I_4$ | 1 | |
| 1 | 1 1 1 0 0 0 | $I_6$ | 1 | 2 |
| 1 | 1 1 0 1 1 0 | $I_8$ | 0 | |
| 1 | 1 1 0 0 0 0 | $I_{10}$ | 0 | |
| 1 | 0 0 0 0 0 0 | $I_{12}$ | 0 | |

| INPUT ADDRESS | OUTPUT CODE | INPUT DIGITAL SIGNAL (IDS) | CODE CORRESPONDING TO IDS |
|---|---|---|---|
| 0 0 0 0 0 0 | 1 1 1 1 1 1 | $I_1$ | $F^*$ |
| 0 0 0 0 0 1 | 1 1 1 1 1 1 | $I_3$ | $F^*$ |
| 0 0 0 0 1 1 | 1 1 1 1 0 0 | $I_4$ | $F^*$ |
| 0 0 0 1 0 1 | 1 1 1 0 1 0 | $I_6$ | $F$ |
| 0 0 1 0 0 1 | 1 1 0 1 1 0 | $I_8$ | $F$ |
| 0 0 1 1 1 1 | 1 1 0 0 0 0 | $I_{10}$ | $F$ |
| 1 1 1 1 1 1 | 0 0 0 0 0 0 | $I_{12}$ | $F$ |

FIG. 11

| INPUT ADDRESS | OUTPUT | INPUT DIGITAL SIGNAL (IDS) | CODE CORRESPONDING TO IDS |
|---|---|---|---|
| 1 X X X X X X X X X X X | 1 1 1 1 1 1 | $I_1$ | $V_1$ |
| 0 1 0 X X X X X X X X X | 1 1 1 1 0 1 | $I_3$ | $V_3$ |
| 0 0 1 0 X X X X X X X X | 1 1 1 1 0 0 | $I_4$ | $V_4$ |
| 0 0 0 1 0 0 X X X X X X | 1 1 1 0 1 0 | $I_6$ | $V_6$ |
| 0 0 0 0 1 0 0 0 X X X X | 1 1 0 1 1 0 | $I_8$ | $V_8^*$ |
| 0 0 0 0 0 1 0 0 0 0 X X | 1 1 0 0 0 0 | $I_{10}$ | $V_{10}^*$ |
| 0 0 0 0 0 0 1 1 1 1 1 1 | 0 0 0 0 0 0 | $I_{12}$ | $V_{12}^*$ |

FIG. 12

| INPUT ADDRESS | | OUTPUT | INPUT DIGITAL SIGNAL (IDS) | CODE CORRESPONDING TO IDS | DECISION RULE |
|---|---|---|---|---|---|
| OUTPUT FROM GATE 62 | OUTPUT FROM SHIFT REGISTER | | | | |
| 1 | 1 X X X X X X X X X X X X | 1 | $I_1$ | $V_1$ | 2' |
| 1 | 0 1 0 X X X X X X X X X X | 1 | $I_3$ | $V_3$ | |
| 1 | 0 0 0 1 0 X X X X X X X X | 1 | $I_4$ | $V_4$ | |
| 1 | 0 0 0 0 0 1 0 X X X X X X | 1 | $I_6$ | $V_6$ | |
| 1 | 0 0 0 0 0 0 0 1 0 0 0 X X | 0 | $I_8$ | $V_9^*$ | |
| 1 | 0 0 0 0 0 0 0 0 0 1 0 0 X | 0 | $I_{10}$ | $V_{10}^*$ | |
| 1 | 0 0 0 0 0 0 0 0 0 0 0 1 — | 0 | $I_{12}$ | $V_{12}^*$ | |
| 0 | 0 0 0 0 X X X X X X X X | 1 | $I_1$ | $F^*$ | 1' |
| 0 | 0 0 0 0 1 X X X X X X X | 1 | $I_3$ | $F^*$ | |
| 0 | 0 0 0 0 0 1 X X X X X X | 0 | $I_4$ | $F^*$ | |
| 0 | 0 0 0 1 0 0 1 X X X X X | 0 | $I_6$ | $F$ | |
| 0 | 0 0 0 0 0 0 0 1 X X X X | 0 | $I_8$ | $F$ | |
| 0 | 0 0 1 0 0 0 0 0 1 X X X | 0 | $I_{10}$ | $F$ | |
| 0 | 1 1 0 0 1 1 0 0 0 1 X X | 0 | $I_{12}$ | $F$ | |

| OUTPUT FROM COUNTER 76 | OUTPUT FROM GATE 62 | INPUT ADDRESS — OUTPUT FROM SHIFT REGISTER | OUTPUT CODE TO REGISTER 80 | OUTPUT CODE TO REGISTER 78 | INPUT DIGITAL SIGNAL (IDS) | CODE CORRESPONDING TO IDS |
|---|---|---|---|---|---|---|
| — | — | 1 X X X X X X X X X X X | 0 0 0 0 | 0 | $I_1$ | $V_1$ |
| — | — | 0 1 0 X X X X X X X X X | 0 0 0 1 | 0 | $I_3$ | $V_3$ |
| — | — | 0 0 1 0 X X X X X X X X | 0 0 1 0 | 0 | $I_4$ | $V_4$ |
| — | — | 0 0 0 1 0 0 X X X X X X | 0 0 1 1 | 0 | $I_6$ | $V_6$ |
| — | — | 0 0 0 0 1 0 0 1 X X X X | 0 1 0 0 | 1 | $I_9$ | $V_8^*$ |
| — | — | 0 0 0 0 0 1 0 0 1 X X X | 0 1 0 1 | 0 | $I_{10}$ | $V_{10}^*$ |
| — | — | 0 0 0 0 0 0 0 0 0 0 0 1 | 0 1 1 0 | 1 | $I_{12}$ | $V_{12}^*$ |
| — | 0 | 0 X X X X X X X X X X X | 0 0 0 0 | 0 | $I_1$ | $F^*$ |
| — | 0 | 0 0 1 X X X X X X X X X | 0 0 0 1 | 0 | $I_3$ | $F^*$ |
| — | 0 | 0 0 0 1 X X X X X X X X | 0 0 1 0 | 0 | $I_4$ | $F^*$ |
| — | 0 | 0 0 0 0 1 X X X X X X X | 0 0 1 1 | 0 | $I_6$ | $F$ |
| — | 0 | 0 0 0 0 0 1 X X X X X X | 0 1 0 0 | 0 | $I_7$ | $F$ |
| — | 0 | 0 0 0 1 1 1 X X X X X X | 0 1 0 1 | 0 | $I_{10}$ | $F$ |
| — | 0 | 0 0 1 1 1 1 X X X X X X | 0 1 1 0 | 0 | $I_{12}$ | $F$ |

CODE-CONVERTING SYSTEM FOR BAND COMPRESSION OF DIGITAL SIGNALS

This is a continuation-in-part of U.S. Ser. No. 918,102, filed June 22, 1978, now abandoned and its continuation U.S. Ser. No. 099,501, filed Dec. 3, 1979, now abandoned.

The present invention relates to a code-converting system for converting a first digital signal containing one number of bits into another digital signal having a different number of bits and, more particularly, to such a system which is adaptable for use with various communications systems, such as a frame-to-frame encoding and decoding system for a band compression of television video signals, for example.

In general, each sample in a signal sequence having $2^N$ signal levels can be represented by a code of a fixed length of N bits. In this case, if the recurrence rate of each signal level is not uniform, each sample can be converted into a sample of either N or less than N bits per sample on an average, by utilizing the variable length-coding technique disclosed on pages 62–81 of "Transmission of Information—A statistical theory of communications" published by the M. I. T. Press, May 1966. This variable length-coding technique enables a sample of the signal level with a large recurrence rate to be converted into a code having a small number of bits.

A sample of the signal level with a small recurrence is converted into a code having a large number of bits. Thus, an average number of bits per sample can be reduced. As a result, there is no deterrent to the band compression efficiency in such a technique, because the recurrence rate of the samples of N or more than N bits is low on an average, over a long period of time. However, this coding technique has a disadvantage in that an average bit length over a short period of time may be increased, even with the temporary increase of the recurrence rate. In addition, there is no fixed number of bits in each sample corresponding to each signal level in this coding technique. As a result, there is a change of the bit-occurrence amount in terms of time.

For this reason, a buffer memory, or the like, is indispensable for uniform data transmission. There is an increase in the capacity of the buffer memory and of the input and output speeds to and from the buffer memory if there is a great difference in the number of bits between the sample of the minimum and maximum number of bits.

These disadvantages can be overcome in a system where a sample of the signal level with a large recurrence rate is converted into a variable length code and a sample of the signal level with a small recurrence rate into a fixed length code. Also, a particular code must be inserted for identifying the types of the codes. The code insertion is between the variable and fixed length codes so as to transmit these codes together. However, since this system requires an insertion of such a particular code, it has the disadvantages in that its structure becomes complicated and that the insertion frequency of the particular code is increased. Consequently, there is less of the desired effect of suppressing the temporary increase of the average code length when the recurrence of the codes of the same type does not last for a long time.

Another system which is capable of reducing the number of types of the variable length codes is described on page 1904 of the "Bell System Technical Journal," August Issue, 1971. This code-converting system enables a use of codes having two kinds of bit lengths, such as a long code and a short code. The short code is assigned to samples having signal levels with a large recurrence rate and the long code to samples having signal levels with a small recurrence rate. A particular code is inserted between the short and long codes and the combination is transmitted as a combination of the short and long codes. The bit length of each code is restricted to two kinds in this system to give a simplification of the system construction, as compared with the above-mentioned M. I. T. system. However, the band compression efficiency cannot be improved as with the system using the variable length-coding technique.

An object of this invention is, therefore, to provide a code-converting system for enabling band compression of digital signals, which system is free from the above-mentioned disadvantages.

According to the present invention, a code converter is used in conjunction with a code-inverse converter. The code converter comprises a first input terminal for receiving an N-bit parallel input digital signal. A first converting means is connected to the first input terminal for converting the input digital signal into a fixed length code which is selected from $2^N$ kinds of fixed length codes. A second converting means is connected to the same input terminal for converting the input digital signal into a variable length code selected from $2^N$ kinds of variable length codes. These fixed and variable length codes correspond to the signal levels of the input digital signals. A first selector selects either the first converting means or the second converting means. A first buffer memory means stores the code supplied from the first selector and transmits the stored code in series to a transmission line and at a constant speed. A first decision-making circuit is connected to the first input terminal for deciding whether the input digital signal has a signal level on one side of a level corresponding to a first predetermined variable-length code, in which case the first selector selects the second converting means. Or, if this input digital signal has a signal level corresponding to a second predetermined variable-length code on the opposite side of the predetermined level, the first selector selects the first converting means. A first register is connected to the first decision-making circuit for storing the output signal from the first decision circuit and for delaying the output signal by one sample period in order to form a delayed output signal which is supplied to the first selector.

The code-inverse converter comprises a serial-to-parallel converter for converting the output code transmitted from the code converter into a parallel code. A first inverse-converting means is connected to the serial-to-parallel converter for inversely converting a fixed length code from the serial-to-parallel converter into an input digital signal corresponding to the fixed length code. A second inverse-converting means is connected to the serial-to-parallel converter for inverse-converting the variable length code, from the serial-to-parallel converter, into an input digital signal corresponding to the variable length code.

A code-boundary detecting means is connected to the serial-to-parallel converter for detecting the boundary between codes in the output from the code converter. A second decision circuit is connected to the serial-to-parallel converter for deciding whether the output code from the serial-to-parallel converter is a fixed length code or a variable length code. A second register is connected to the second decision-making circuit for storing the output signal from the second decision-making circuit and for delaying the output signal by one sample period. A second selector selects between first and second inverse-converting means in response to the output signal from the second register. A second buffer memory is connected to the second selector for storing the output digital signal from the second selector in response to the output signal fed from the code-boundary detecting means and for reading out the stored digital signal at a constant speed.

The present invention will be described in more detail in conjunction with the accompanying drawings, in which:

FIG. 1 is a block diagram of a code converter for use in this invention;

FIGS. 2(a) through 2(h) are time charts for describing the operation of the code converter shown in FIG. 1, more particularly:

FIG. 2(a) indicates a succession of sixteen sample periods, by way of example;

FIG. 2(b) indicates a series of input signals;

FIG. 2(c) shows an initial setting pulse;

FIG. 2(d) indicates a delayed selector control pulse;

FIG. 2(e) indicates the length of successive codes;

FIG. 2(f) represents variable length codes;

FIG. 2(g) indicates fixed length codes;

Figure 3:
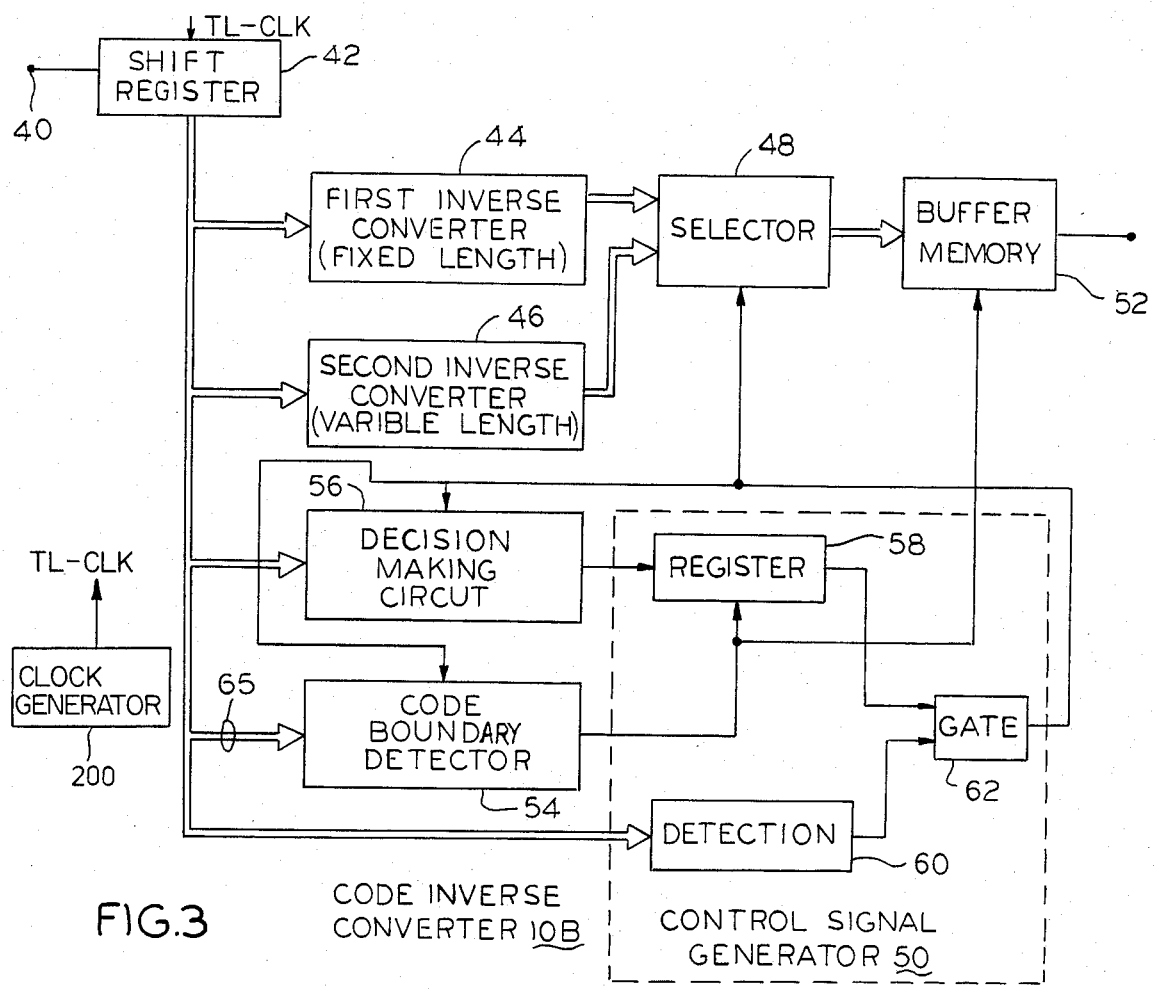
FIG. 3 is a block diagram of a code-inverse converter for use in this invention.

FIGS. 5(a) through 5(i) are time charts for describing the operation of the code-inverse converter of FIG. 3, more particularly:

FIG. 5(a) is a train of clock pulses;

FIG. 5(b) is a series of variable and fixed length codes;

FIG. 5(c) is a series of code boundary signals;

FIG. 5(d) is an inverted series of code boundary signals which are delayed by one bit period;

FIG. 5(e) is a series of code length detector output signals;

FIG. 5(f) is a series of code length detector signals which are delayed by one bit period;

FIG. 5(g) is a series of counter set signals;

FIG. 5(h) is a series of detection control signals; and

Figure 1:
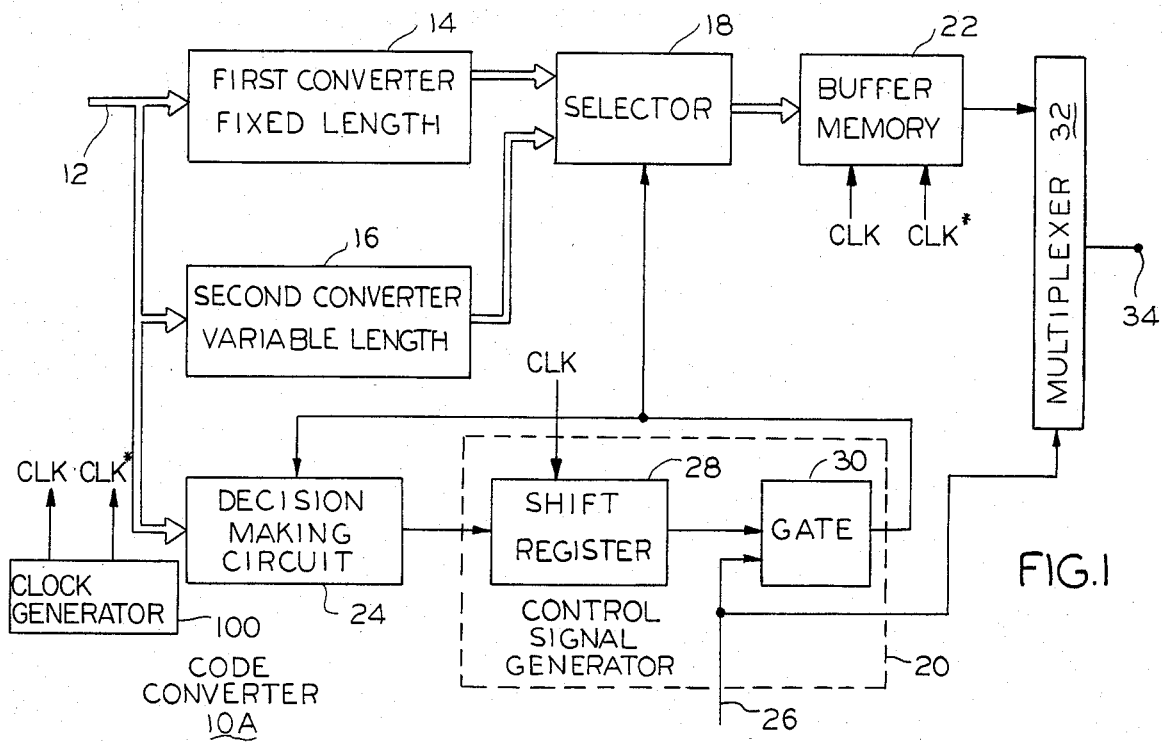
Figure 2:
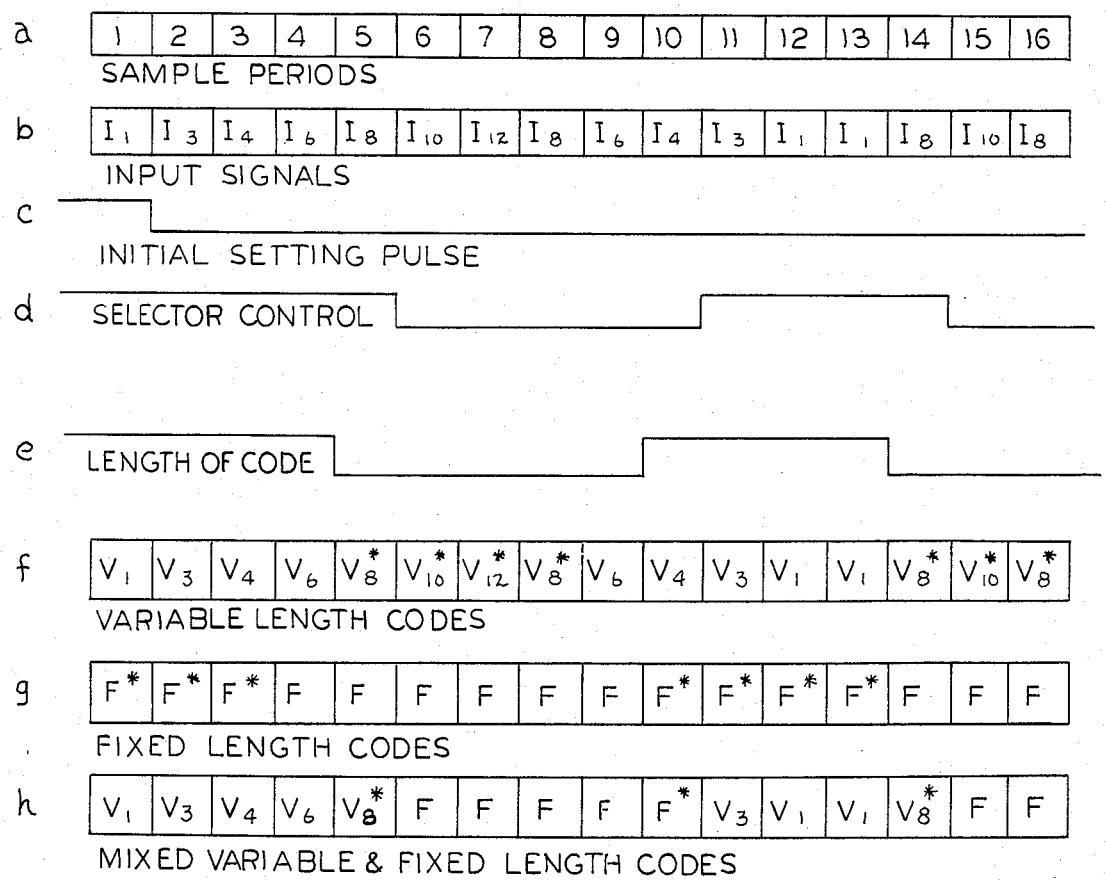
FIG. 2(h) represents a mixture of fixed and variable codes.
Figure 4:
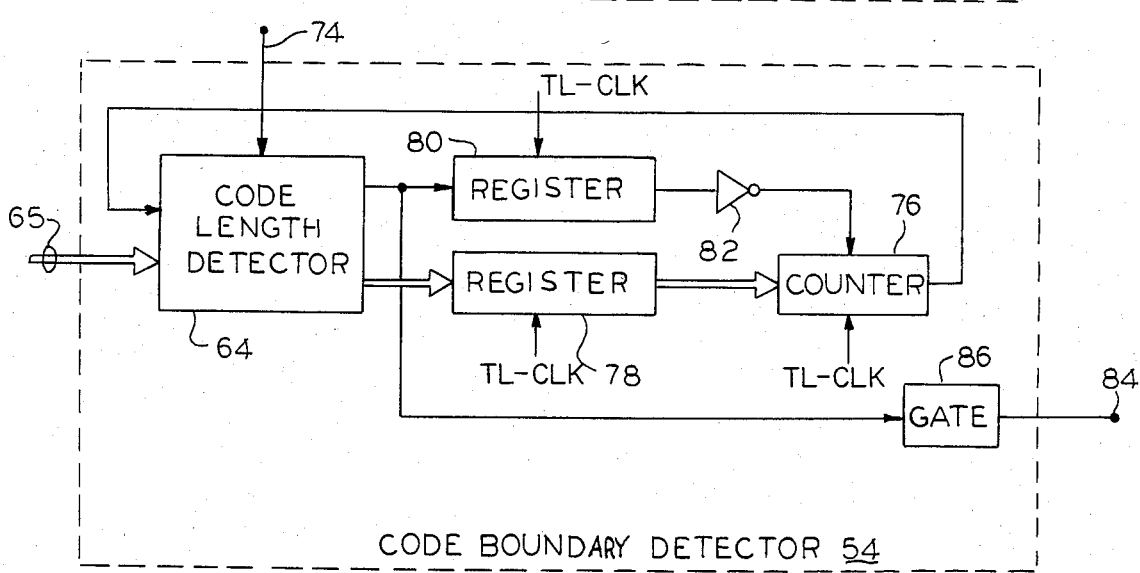
FIG. 4 is a block diagram of a code-boundary detecting circuit.
Figure 5:
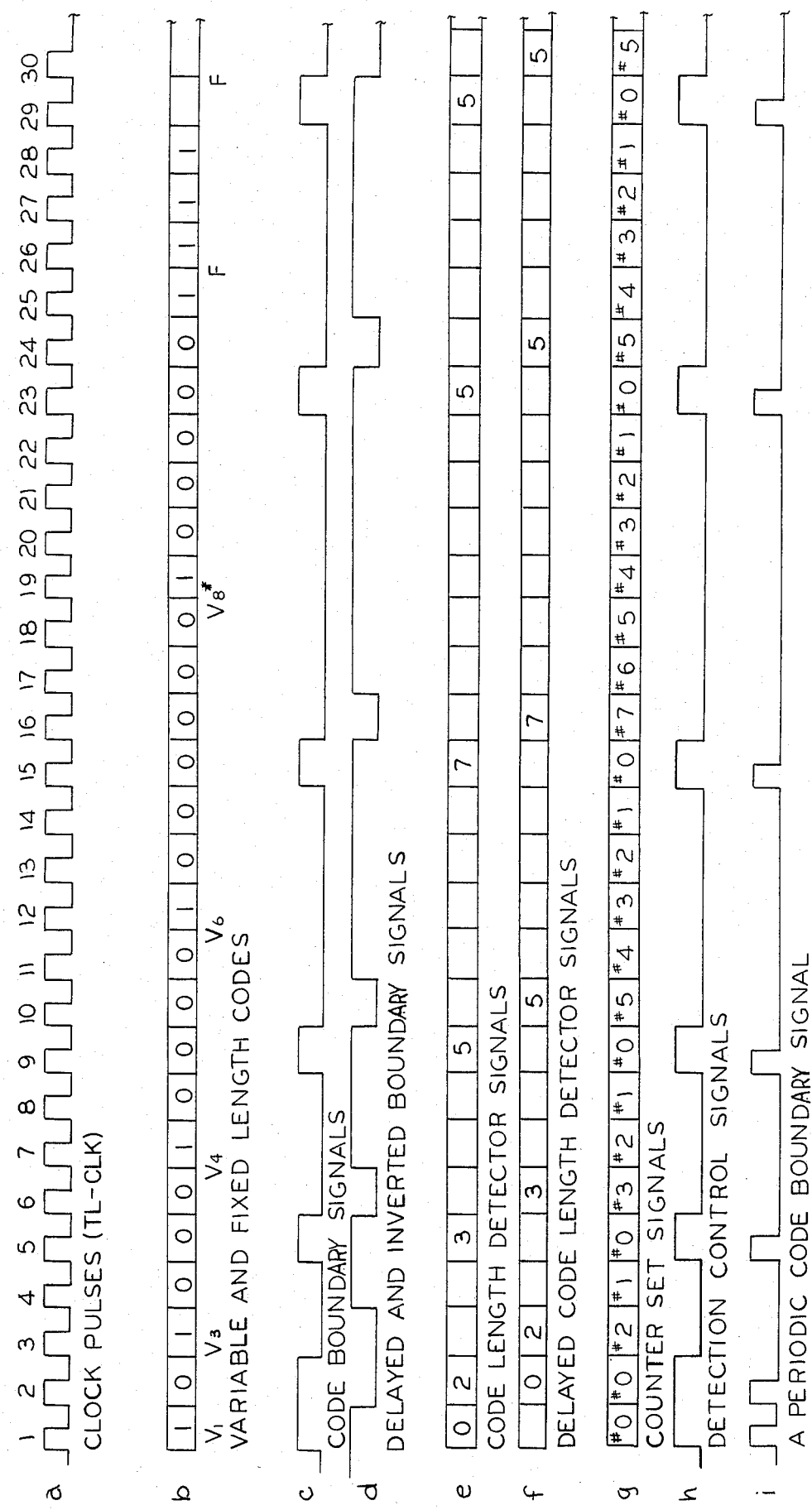
Figures 8, 9:
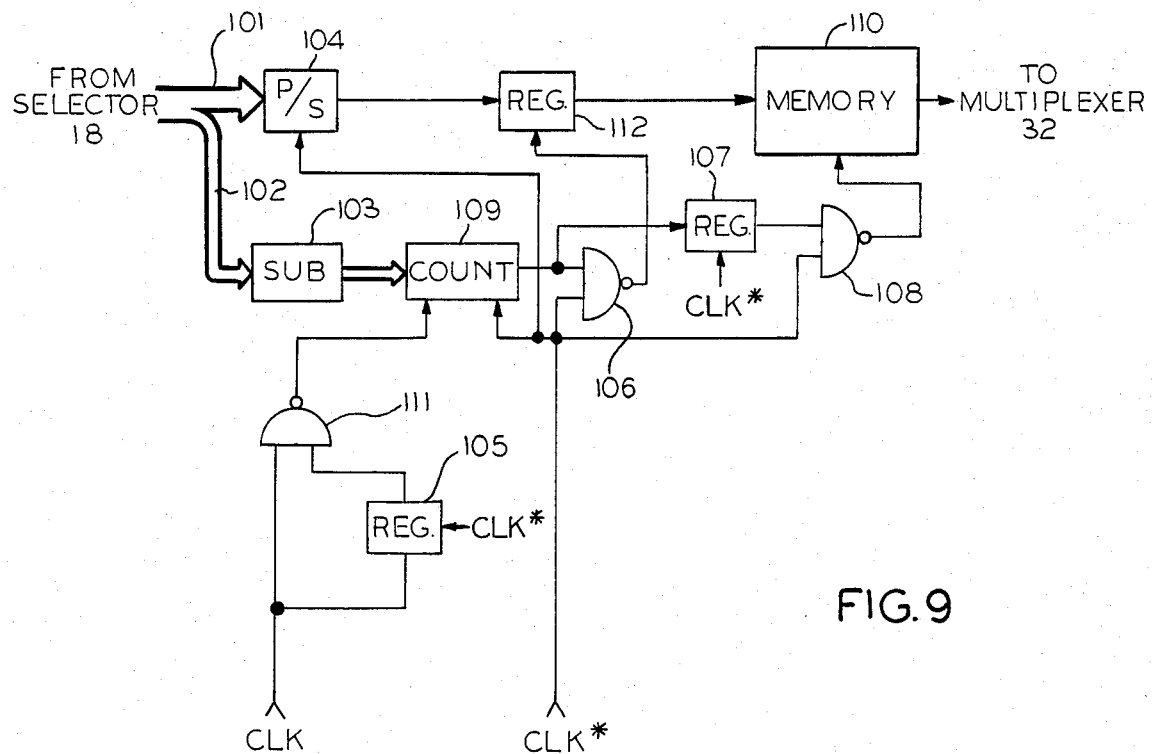
Figure 10:
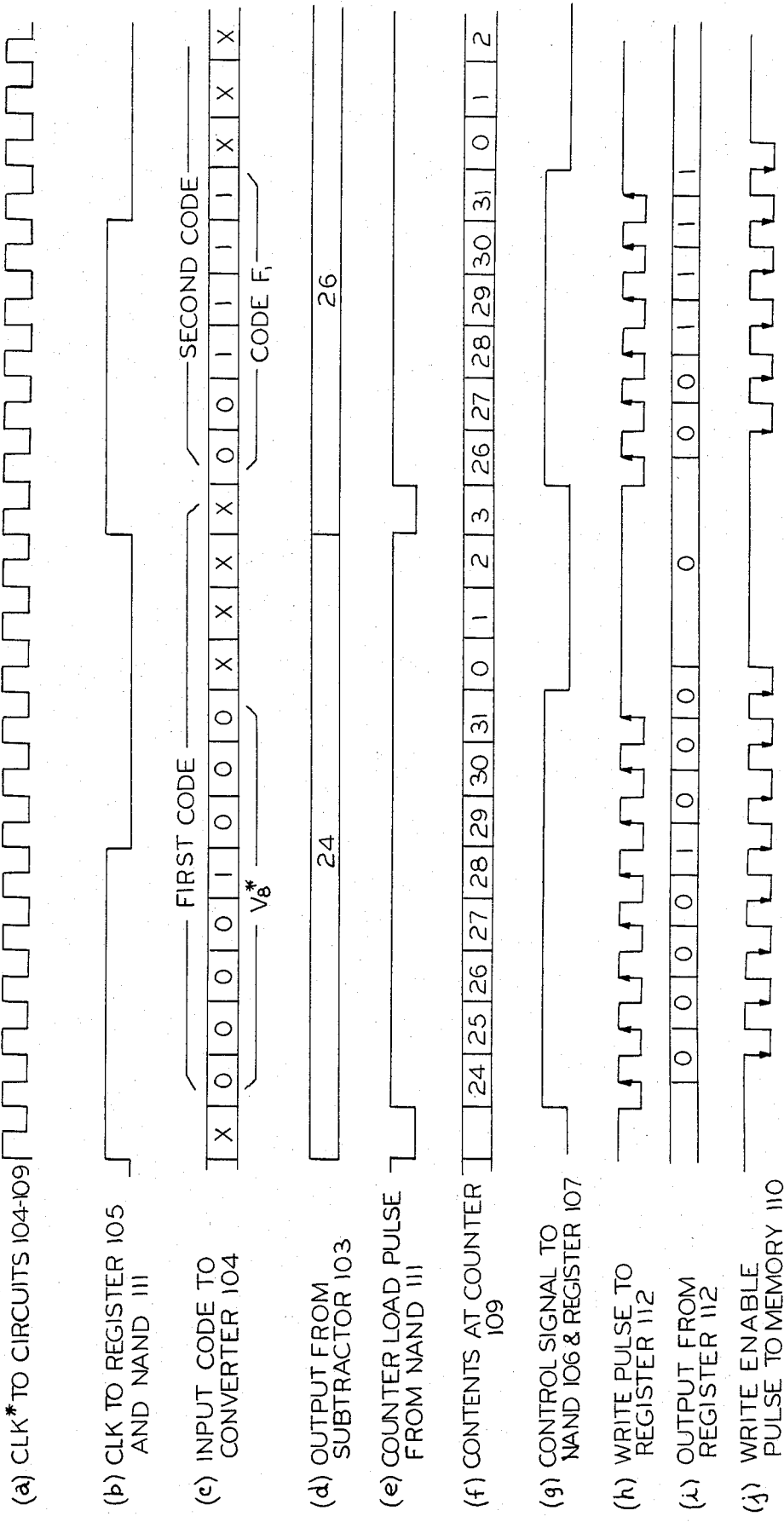

FIG. 5(i) is a series of a periodic code boundary signals;

FIGS. 6 and 7 are two code conversion charts which show an input to an output code relationship of the fixed length and variable length converters of FIG. 1;

FIG. 8 shows a relationship between signals appearing in FIG. 1 which determines whether a decision Rule 1 or Rule 2 shall apply to the circuit of FIG. 1;

FIG. 9 shows the internal construction of a buffer memory shown in FIG. 1;

FIG. 10 is a timing chart which shows the signals that appear in the buffer memory circuit of FIG. 9 at the circuit points which are identified in the left-hand most column of FIG. 10;

FIGS. 11 and 12 show an input to output code relationship for converters of FIG. 3;

FIG. 13 shows a relationship of signals which appear in FIG. 3 and which determine whether a Rule 1' or a Rule 2' applies; and FIG. 14 is a table which shows an input address to an output signal relationship of a code length detector which appears in FIG. 4.

DESCRIPTION OF THE PREFERRED EMBODIMENTS

A code converter 10A of FIG. 1 has an input terminal 12 for receiving a digital signal composed of 6-bits which are applied thereto in parallel. A first converting means 14 is used for converting the 6-bit digital signal into fixed length codes consisting of 6-bits. A second converting means 16 is provided for converting the digital signal into variable length codes having 12-bits, at most. A selector 18 is provided for selecting between the outputs of the first and second converting means 14 and 16 in response to control signals which are given from a control signal generator 20. A buffer memory 22 having a dummy code-removing function stores each output code as it is fed from the selector 18 and reads out to a transmission channel the stored codes at a constant speed, (represented by the clock pulses "TL-CLK" illustrated in FIG. 5[a]).

Both of the first and second converting means 14 and 16 can be formed by a read-only memories (referred to as "ROM" hereinafter). Variable length codes and fixed length codes corresponding to respective ones of 64-different kinds of input signals represented by 6-bits are written into these ROMs, respectively.

Each of the FIGS. 6 and 7 shows an input address to output code relationship of the ROM 14 or 16 whose seven output codes are addressable by six-bit input address signals. More definitely, each output code is composed of either a variable length ($V_N$ or $V_N^*$) code or a six bit fixed (F or F*) code; a four-bit code for indicating the code length of the ($V_N$ or $V_N^*$) or (F* or F), and a dummy code of at least one bit. The $V_N$ code (N=1, 3, 4, 6) has a code length of N bits (for example, $V_3$ code has three bits). On the other hand, the $V_N^*$ code (N=8, 10, 12) has a code length equal to or larger than a predetermined code length (8 bits). The reference letter $I_N$ (N=1, 3, 4, 6, 8, 10, 12) denotes a 6-bit input digital signal having a level corresponding to the variable length code $V_N$ or $V_N^*$. The F* code corresponds to an input digital signal $I_1$, $I_3$ or $I_4$. The F code corresponds to an input digital signal $I_6$, $I_8$, $I_{10}$, or $I_{12}$. The dummy code, which takes a predetermined bit pattern such as all 0's or 1's, is added to form a sixteen-bit output code, so that an input of equal code length is always given to the selector 18 despite the difference in the code length of the $V_N$ or $V_N^*$ code and F or F* code. For this reason, the sixteen-bit length is selected, taking into account the maximum code length (or twelve bits) of the $V_N^*$ code and four bits indicative of a true code length of a given $V_N$, $V_N^*$, F or F* code.

For details relating to these variable length codes reference may be made to the above-mentioned M. I. T. literature.

The code converter 10A further comprises a decision-making circuit 24, formed by a ROM, for deciding whether the input digital signal should be a fixed length code or a variable length code. Decision-making circuit 24 operates in response to control signals from the control signal generator 20. The control signals depend on an output signal from the decision circuit 24. An initial setting pulse appears at terminal 26 of the generator 20 so that a control signal is given to the selector 18 in order to initially select the second converting means 16. The generator 20 also includes a shift register 28 for storing the decision output signal fed from decision-making circuit 24 and for delaying the decision output signal by one sample period. The inputs of a gate circuit 30 are connected to the register 28 and in common with the input of a multiplexer 32 for generating an initial setting signal in response to an externally supplied initial pulse, the generated initial setting signal being delivered to an output terminal 34 leading to a transmission channel. The gate circuit 30 supplies the control signal to cause the selector 18 to select the second converting means 16 and to cause the decision-making circuit 24 to make an initial setting when an input signal is given to the terminal 26. Also, the gate circuit 30 applies the output signal to both the selector 18 and the decision-making circuit 24 when the initial setting pulse is not given to the terminal 26. In this embodiment, a code having 12-bits, all of binary "0", is used as the initial setting signal. A clock pulse generator 100 supplies clock pulses CLK* to the buffer memory 22. Also, clock pulses CLK are produced at the generator 100 by dividing the CLK* pulses. The divided pulses CLK are fed to the register 28 and the memory 22.

Moreover, the following decision rules are memorized in the decision-making circuit 24. That is to say, the control signal generator 20 gives such a control signal to the selector 18 so as to select the first converting means 14. The decision circuit 24 decides whether the input digital signal has a level corresponding to a variable length code (a variable length code A) having a code length equal to or less than a given code length (4-bits). If the input digital signal has a level corresponding to code A, the control signal is inverted and supplied to the register 28.

In contrast, if the digital signal has a level which is greater than the given code A, the control signal is given to the register 28 without inversion (decision Rule 1). In addition, when the control signal generator 20 gives a control signal to the selector 18 which selects the second converting means 16, the decision circuit 24 decides whether the input digital signal has a level corresponding to a variable length code (a variable length code B) having a code length equal to or more than a given code length (8-bits). If the input digital signal has a level corresponding to code B, the control signal is inverted and then supplied to the register 28. If the input digital signal does not reach a level corresponding to code B, the control signal is applied directly to the register 28 (decision Rule 2).

These decision Rule 1 and 2 are described next by referring to FIG. 8. In greater detail, a six-bit input address (left most column of FIG. 7) and a one-bit output given from the gate circuit 30 (left most colum of FIG. 7) are supplied to the decision making circuit 24 in order to produce a one-bit control signal which is supplied to the selector 18. The decision Rule 1 or 2 is selected depending on whether the output of gate 30 is a "0" or a "1".

Next, the operation of the code converter 10A will be described in detail with reference to the time charts in FIGS. 2(a) to 2(h).

During the sample period 1, the initial setting input signal (FIG. 2(c)) appears at input terminal 26 (FIG. 1) and is applied to cause the initial setting in order to select the second converting means 16. During this period, the input digital signal I1 has a level corresponding to the variable length code V1 and is converted into both the fixed length code F* and the variable length code V1, respectively, by the converting means 14 and 16. The selector 18 selects the second converting means 16 so that the variable length code V1 is written into the buffer memory 22 after removing the dummy code.

During the sample period 2, the input digital signal I3 is converted into both the fixed length code F* and the variable length code V3, respectively, by the converting means 14 and 16. At the same time, the level of digital signal I3 is judged by the decision-making circuit 24. Since the second converting means 16 is selected by the selector 18, the decision circuit 24 decides the level of the digital signal I3 on a basis of the above-described decision Rule 2. In accordance with this decision Rule 2, the control signal applied to the decision-making circuit 24 is transferred to the register 28 without inversion, since the digital signal I3 is assumed to have a code length which is less than 8 bits. In a similar manner, the control signal is not inverted during either one of the sample periods 3 and 4, since each of the digital signals I4 and I5 is assumed to have a code length which is less than 8-bits. As a result, the selector 18 maintains its selection of the second converting means 16. Therefore, the variable length codes V4 and V6 are written into the buffer memory 22.

Next, during the sample period 5, the code length of the digital signal I8 is 8-bits so that the supplied control signal is inverted and then applied to the register 28 (as illustrated in FIG. 2(e)). However, this inverted control signal is given to the selector 18 after a delay of one sample period through the shift register 28 (as illustrated in FIG. 2(d)). Consequently, the selector 18 still maintains its selection of the converting means 16 during this sample period 5. The variable length code V8* is written into the buffer memory 22.

During the sample period 6, the digital signal I10 is converted into the fixed length code F and the variable length code V10* by the converting means 14 and 16, respectively. In this sample period 6, the inverted control signal stored in the register 28 during the sample period 5 controls the selector 18 to switch its selection to the first converting means 14 instead of the second converting means 16. The result is that the fixed length code F is written into the buffer memory 22. On the other hand, the decision-making circuit 24 decides the level of the input digital signal, responsive to the above-mentioned decision Rule 1. The first converting means 14 is selected by the selector 18 during the sample period 6. According to this decision Rule 1, the input digital signal I10 has a code length which is larger than 4-bits. Therefore, the control signal given to the decision-making circuit 24 is sent to the register 28 without inversion.

During the sample periods 7, 8 and 9, each of the digital signals I12, I8 and I6 has a code length which is larger than 4-bits. Consequently, the control signals are not inverted in any of these respective cases. As a result, the selector 18 maintains its selection of the first converting means 14 so as to give the fixed length codes F, F and F to the buffer memory 22 during the sample periods 7, 8 and 9, respectively.

During the sample period 10, the lengths of the digital signal I4 and the four-bit digital signal are equal to each other. For this reason, the supplied control signal is inverted and then applied to the shift register 28. Before it is fed to the selector 18, this inverted control signal is delayed by one sample period in the shift register 28.

The selector 18 maintains its selection of the first converting means 14, and the fixed length code F* is sent to the buffer memory 22.

During the next sample period 11, the digital signal I3 is converted into the fixed length code F* and the variable length code V3 by the converting means 14 and 16, respectively. In this sample period 11, the previous selection of the first converting means 14 is changed to the second converting means 16 by the selector 18 responsive to the inverted control signal which was stored in the shift register 28 during the sample period 10. Thus, the variable length code V3 is given to the buffer memory 22. On the other hand, the decision-making circuit 24 decides the level of the input digital signal (depending on the decision Rule 2) until the second converting means 16 is no longer selected, since the selector 18 selects the converting means 16 in this sample period 11.

If the second converting means 16 has been selected at the time when an input signal with a variable length code having a length which is equal to or larger than 8-bits is received, then the selector 18 changes its selection to the first converting means 14 from the following sample period. In contrast, if the converting means 16 has been selected at the time when an input digital signal with a variable length code having a length which is equal to or smaller than 4-bits is received, then the second converting means 16 is selected by the selector 18 from the succeeding sample period. The respective output codes from the converting means 14 and 16 and the selector 18 in these sample periods are illustrated in FIGS. 2(f), 2(g) and 2(h), respectively.

Next, the structure and operation of the buffer memory 22 will be described in detail with reference to FIGS. 9 and 10. To the memory 22 is sequentially supplied a first code (FIG. 10(c)) containing the code $V_8^*$ (00001000) shown in FIG. 7 and a second code (FIG. 10(c)) containing the F code (001111) shown in FIG. 6. Twelve bits of the first code are given in parallel to a parallel to serial (P/S) converter 104, whereas the remaining four bits are given in parallel to a subtractor 103. Controlled by the clock pulse CLK* given from the clock pulse generator 100, the converter 104 performs the parallel to series conversion of a given twelve-bit parallel input, so that the converted signal is stored in a register 112. The clock period $N_M$ of the clock pulse train CLK* is one-twelfth the period of the clock pulse train CLK shown in FIG. 2(a,) to provide enough time for enabling the converter 104 to complete the parallel to series conversion within one clock period of the CLK pulse train. The subtractor 103 subtracts the code length (N) of the first code from a value 32 which is supplied to a counter 109 (FIG. 10(d)). A load pulse (FIG. 10(e)) is supplied from a NAND gate 111 to the counter 109 in response to each clock pulse of the CLK series. The same clock pulse is delayed at a register 105 by one clock period of the CLK* series. While values ranging from 16 to 31 are counted at the counter 109, a logical "1" is continuously supplied from the counter 109 to a NAND gate 106 and to a register 107, as a control signal (FIG. 10(g)) for removing the dummy code. With this control signal and the clock pulse CLK*, the code $V_8^*$ is stored (FIG. 10(i)) in the register 112, in response to a write pulse (FIG. 10(h)). On the other hand, the clock pulse CLK* and the control signal delayed at the register 107 are supplied to a NAND gate 108 to provide a pulse which is a write-enable pulse (FIG. 10(j)). In response to the output of gate 108, the memory 110 stores the $V_8^*$ code given from the register 112.

The reason for setting the value at 32 is, as follows: As mentioned above, to remove the dummy code, the counter 109 produces the logical "0" on the appearance of the F, F*, $V_N$ or $V_N^*$ code at the P/S converter 104, whereas it produces the logical "1" on the appearance of the dummy code. As is apparent from FIG. 7, twelve is the maximum code length of the $V_N^*$ code, and eleven is that of the dummy code. Therefore, the counter 109 is required to output the logical "0" during its counts of 0 to 10 (corresponding to the length of longest dummy code) and the logical "1" during its counts of 11 to 22 (corresponding to the length of the longest code $V_{12}^*$). Actually, since such a counter is not available, a binary counter which is capable of counting up to $32 = 2^5$ is employed as the counter 109.

A code-inverse converter 10B (FIG. 3) comprises an input terminal 40 where the output code from the code converter 10A is received, in series, from the transmission channel. A shift register 42 has taps for temporarily storing this code and for converting it into a parallel code. First and second inverse-converting means 44 and 46 convert the output code fed from the shift register 42 into the original digital signal, depending upon the fixed length or the variable length of the output code. The number of taps on the shift register 42 is twelve in this embodiment since that number coincides with the maximum length of the variable length code. The first and second inverse-converting means 44 and 46 may be formed by ROMs which memorize inverse-conversion rules having inverse relationships with respect to the conversion rules memorized in the ROMs forming the fixed length code-converting means 14 and the variable length code-converting means 16. Each of the FIGS. 11 and 12 shows an input address to output code relationship of the first and second converters 44 or 46, each of which may be a ROM.

The code-inverse converter 10B further comprises a selector 48 for selecting either the first or the second inverse-converting means 44 or 46 in response to control signals given from a control signal generator 50. A speed-converting buffer memory 52 stores the output digital signal fed from the selector 48 under the control of an aperiodic code-boundary signal (as illustrated in FIG. 5(i)) which is derived as a timing signal from a code-boundary detecting circuit 54. Also, the code-inverse converter 10B comprises a decision-making circuit 56 for deciding whether the output code given from the shift register 42 is a fixed length code or a variable length code, responsive to the control signal from the control signal generator 50. The code-boundary detecting circuit 54 is connected to the shift register 42 for detecting the boundary between the supplied codes. The control signal generator 50 produces a control signal for controlling the selector 48 responsive to the output of the decision-making circuit 56. A clock generator 200 supplies the clock pulses TL-CLK to the shift register 42 and the code boundary detector 54.

This control signal generator 50 includes a register 58 for temporarily storing the decision output signal given from the decision circuit 56, under the control of an output signal from the code-boundary detector circuit 54, as a timing signal, for giving a delay of one sample period to the decision output signal. A detection circuit 60 (consisting of a NOR gate) is connected to the shift register 42 for detecting the initial setting signal. A gate circuit 62 is connected to the register 58 and to the detection circuit 60 for supplying an output signal from the register 58 directly to the selector 48 and to the decision-making circuit 56 when the initial setting signal is not detected in the detection circuit 60 (i.e., when the detection output signal given from circuit 60 is binary "0"). The control signal also operates the selector 48 to select between the inverse converting means 44, 46 (initially circuit 46 is selected). The decision-making circuit 56 receives the control signal when the initial setting signal is detected in the detection circuit 60 (i.e., when the output from the detection circuit 60 is a binary "1"). Further, memorized in the decision-making circuit 56 are decision rules which are similar to the decision rules memorized in the decision-making circuit 24 in the code converter 10A.

The decision Rule 1' and 2' are shown in detail in FIG. 13. Twelve bits of the output of the shift register 42 (FIG. 3) and the one-bit output of the gate circuit 62 are given to the decision circuit 56, as an address. Responsive thereto, the circuit 56 produces a one-bit control signal which is supplied to the selector 48. The decision Rule 1' or 2' is similar to the Rule 1 or 2 (selected by the circuit 24 FIG. 1). Rule 1' or 2' is selected in FIG. 3, depending on whether a logical "0" or "1" appears at the output of the gate circuit 62.

The code-boundary detecting circuit 54 (shown in detail in FIG. 4) detects the boundary between the codes.

This detecting circuit 54 is composed of a code-length detector 64 connected to the shift register 42 (via wires 65). Detector 64 includes an ROM for storing a predetermined rule. Under this rule, a number is produced which is smaller by one than the bit length of the predetermined variable length code. This smaller number is produced responsive to the number of binary "0"s which are counted from the most significant bit of the code together with a code-boundary signal which is indicative of the presence of binary "0" in the most significant bit. For example, this code-length detector 64 produces a digital signal corresponding to the number "3" (which is smaller by one than the bit length 4 of the code V4) when there are two binary "0"s.

This detector 64 also memorizes another rule by which the code length is decided to be "1." According to this rule, a binary "0" is produced when the most significant bit is a binary "1" and a code-boundary signal is produced to indicate the presence of binary "1" in the most significant bit. Furthermore, the code-length detector 64 memorizes still another rule to detect the code length of the fixed length code. By this rule, a digital signal corresponding to the number "5" (which is smaller by one than the number "6" corresponding to the bit length of the fixed length code) and a code-boundary signal are produced when the control signal for selecting the converting means 44 is given to the code-length detector 64 through a terminal 74 fed from the control signal generator 50.

The code boundry detecting circuit 54 also includes a counter 76 control signal for producing a detection control signal to inhibit the operation of the detector 64 for a period of time corresponding to a code bit length given to the detector 64 (for example, three bits in the case of code V3). Consequently, it follows that the operation of the detector 64 is prohibited when a given code is not supplied. This counter 76 produces the detection control signal when all of its outputs are at a binary "0". A synchronous binary up/down counter N74191 described on pages 187-189 of the "SIGNETICS DATA MANUAL" published by SIGNETICS, 1976, may be employed as the counter 76.

In addition, the code boundry detecting circuit 54 has a register 78 for delaying the output signal fed from the code-length detector 64 by a period equal to one bit and for supplying the thus delayed signal as an input signal to the counter 76. A second register 80 delays the code-boundary signal of detector 64 by a period equal to one bit. An inverter 82 inverts the output signal from register 80 to form a load signal to the counter 76. It should be noted that the clock pulses TL-CLK from the generator 200 shown in FIG. 3 are supplied, as a timing signal, to the registers 78 and 80 (FIG. 4) to the counter 76. The reference numeral 84 denotes an output terminal of the code-boundary detecting circuit 54. The reference numeral 86 denotes a gate circuit for shaping the pulse width of the output signal of the code-length detector 64. Shaping is such that the output signal of the detector 64 is used as a timing signal for the buffer memory 52.

FIG. 14 shows an input address to output code relationship of the code length detector 64, which is a ROM. The twelve-bit output of the shift register 42, the one-bit output of the counter 76, and the one-bit output of the gate circuit 62 are given, as an address, to the ROM 64. The ROM 64 produces a five-bit output code consisting of one bit for initiating the counter 76 and four bits to be stored in the register 78. The logical "0" or "1" output of the gate circuit 62 is used to determine the code length of the $V_N$, $V_N^*$, F, or F* code, which is defined above with reference to FIGS. 6 and 7.

Next, the operation of the code-inverse converter 10B will be described by referring to the time charts illustrated in FIGS. 5(a) to 5(i).

In response to the detection of the initial setting signal by the detection circuit 60 (FIG. 3), the selector 48 selects the second inverse-converting means 46, responsive to the initial setting signal. Subsequently, the output codes from the code converter 10A are supplied to the shift register 42 in succession. The detecting circuit 54 and the decision making circuit 56 do not produce their output signals, respectively, until the variable length code V1 reaches the final stage of the shift register 42. Consequently, the output digital signals fed from the first and second inverse-converting means 44 and 46 are not written into the buffer memory 52.

Assume now that the variable length code V1 (FIG. 5(b)) reaches the final stage of the shift register 42 at the time of clock pulse 1 (FIG. 5(a)), the decision circuit 56 decides upon the type of the input code depending on the decision Rule 2. This is similar to the operation of the decision circuit 24 in the code converter 10A. Since the input variable length code V1 is shorter than the variable length code V8, the control signal given to the decision making circut 56 is not inverted in accordance with the decision Rule 2. At the time of the clock pulse 1, the detector circuit 54 gives the code-boundary signal (FIG. 5(c)) which is indicative of the incoming variable length code V1 (the boundary between the codes) to the register 58.

On the other hand, the code-length detector 64 (FIG. 4) detects the bit length of the variable length code V1 and supplies the code-length detection signal (FIG. 5(e)) representing the bit length of the code V1 to the register 78. At the same time, the detector 64 produces the code-boundary signal (FIG. 5(c)) indicative of the boundary of the code V1 to the register 80. The gate circuit 86 shapes, this code-boundary signal to form the timing signal of FIG. 5(i). The digital signal corresponding to the variable length code V1 is inverse-converted into the original signal by the second inverse converting means 46 (i.e., the digital signal I1 is written into the buffer memory 52).

At the time of the clock pulse 2, the level of the variable length code V3 is detected and, therefore, decided in the decision making circuit 56, depending on the decision Rule 2. At this time, the code-length detection signal, from the code-length detector 64, responsive to the timing of the clock pulse 1, is delayed by one bit period (FIG. 5(f)) by the register 78. On the other hand, the code-boundary signal (FIG. 5(c)), obtained from the detector, at the time of the clock pulse 1 is delayed by a one bit period by the register 78. Thereafter, it is inverted by the inverter 82 (FIG. 5(d)). As soon as the output signal from this inverter 82 is applied as the load signal to the counter 76, it is set to be the same as the output signal of the register 78. In other words, the counter 76 is set to "0" (FIG. 5(g)). For example, if the output signal from the register 78 is "2", then the counter 76 is set to "2". As a result, the counter 76 gives the detection control signal to the detector 64 with a result that the code-length detector 64 detects the bit length of the succeeding code (i.e., the code V3).

At the clock pulse 2, the detector 64 gives the code-length detection signal and the code-boundary signal to the registers 80 and 78. Also, at the clock pulse 2, the decision output signal and the digital signal I3 obtained by the inverse-conversion are applied to the register 58 (FIG. 3) and the buffer memory 52 under control of the code-boundary signal given from the detector 64.

At the time of the clock pulse 3 and the clock pulse 4 shown in FIG. 5(a), the number "2" corresponding to the code length of the code V3 is counted down in the counter 76 (FIG. 5(g)). Consequently, the counter 76 does not return the detection control signal to the code-length detector 64 during these clock periods (FIG. 5(h)). As a result, the detector 64 does not operate during the period of these clock pulses 3 and 4.

At the time of the clock pulses 5 and 9, the boundaries of the variable length codes V4 and V6 are detected by the circuit 54. The digital signals I4 and I6, obtained by the inverse conversions of the variable length codes V4 and V8, are written into the buffer memory 52 under the control of the code-boundary signal (FIG. 5(i)).

At the time of the clock pulse 15, the boundary of the variable length code V8* is detected by the detecting circuit 54. Simultaneously with this detection, the decision making circuit 56 inverts the control signal depending on the decision Rule 2. This inverted-control signal is given to the selector 48 after the inverted-control signal is delayed by the code-boundary signal in the register 58. As a result, the selector 48 still maintains its selection of the second inverse-converting means 46. The digital signal I8 is written into the buffer memory 52. During the time period of the clock pulses 16 to 22, the following code boundaries are not detected with a result that the content of the register 58 is preserved. Then, at the time of the clock pulse 23, the code boundary of the fixed length code F of the succeeding code is detected. Consequently, the inverted-control signal stored in the register 58 during the time of the clock pluse 15 is read out responsive to the code-boundary signal. As a result, the selector 48 changes its selection from the second inverse converting means 46 to the first inverse converting means 44. At this clock pulse 23, the digital signal (F digital signal) corresponding to the fixed length code F, obtained by the inverse conversion in the first inverse-converting means 44, is written into buffer memory 52 (FIG. 3) responsive to the code-boundary signal. Immediately after the decision making circuit 56 decides that the input code is a fixed length code F*, the selector 48 selects the second inverse-converting means 6 at the time of the inverse conversion of the following code, depending on the decision Rule 1. (This process is not illustated in FIGS. 5(a) to 5(i)). In this way, the output digital signal from the selector 48 is written into the buffer memory 52 every time that the boundary between the codes is detected by the code-boundary detecting circuit 54.

According to this invention, a particular code is not needed between the variable length code and the fixed length code to indicate the boundary between these codes, thus simplifying the construction of the code converting system. In addition, the code converting system of this invention may be placed in a stage following a predictive encoding circuit which is used in a coding system for high band compression efficiency of television video signals. The present invention contributes to the higher-efficiency encoding of the television signals.

Further, to simplify the systems, it is possible to eliminate the first converting means 14 (FIG. 1) for converting the input digital signal having 6-bits and the first inverse-converting means 44 for inversely converting the fixed length code into the original digital signal. The six-bit input digital signal is given, as a fixed length code, from the input terminal 12 directly to the selector 18. While the code-boundary detecting circuit 54 detects the boundary between the variable length codes, as shown in the embodiment, the detection of the code boundary with respect to other types of variable length codes can be easily realized by modifying the contents of the ROM in the detecting circuit 54.

The reference code bit lengths in the decision Rules may be altered to provide for other code bit lengths, for example, 6-bits and 3-bits as well as for the above-mentioned 8-bits and 4-bits. Moreover, the input digital signal having a code length equal to or greater than 8-bits can be converted into a fixed length code having a code length other than 6-bits.

In the above embodiment, the type of the code allotted to the digital signal to be supplied during the following sample period is determined by the code length of the variable length code allotted in the supplied digital signal. In another embodiment, the type of the code can also be determined by the level of the supplied digital signal. In this case, the arrangement of the system is the same as the system mentioned above, except for the decision Rules memorized by the ROMs in the decision making circuit 24 of the code converter 10A and the decision circuit 56 of the code-inverse converter 10B.

For this other embodiment, these decision Rules should be modified. A decision Rule 1 in this case is determined, in the following manner. The decision making circuit 24 (FIG. 1) compares the level of the input digital signal with a first predetermined threshold level TH1 where the control signal generator 20 supplies to the selector 18 the control signal to select the first converting means 14. As a result, the control signal is inverted and then applied to the register 28 if the level of the input digital signal is equal to or less than the threshold level TH1. In contrast, the control signal is given to the register 28 without inversion if the level of the input digital signal is more than the threshold level TH1. A decision Rule 2 is determined in the following manner.

The decision circuit 24 compares the level of the input digital signal with a second predetermined threshold level TH2 if the control signal generator 20 supplies to the selector 18 the control signal for selecting the second converting means 16. Consequently, the control signal is inverted and then applied to the register 28 if the level of the input digital signal is equal to or more than the threshold level TH2 and the control signal is given to the register 28 without inversion if the level of the input digital signal is less than the threshold level TH2.

| REFERENCE NUMERAL | DEVICE | KNOWN CIRCUIT FOR PROVIDING THE STATED FUNCTIONS |
|---|---|---|
| 14 | First Converter Fixed Length | Fairchild Isoplanar Schottky TTL Memory 93446 (pp. 7-111 to 7-113 Reference 1 |
| 16 | Second Converter Variable Length | |
| 18 | Selector | SN 74157 (pp. 318-322 of Reference 2) |
| 22 | Buffer Memory | BM (FIG. 1, page 1176, of Reference 3) |
| 24 | Decision-Making Circuit | Fairchild Isoplanar Schottky TTL Memory 93446 (of Ref. 1) |
| 28 | Shift Register | SN 7474 (page 76 of Ref. 2) |
| 30 | Gate | SN 7408 (page 64 of Ref. 2) |
| 42 | Shift Register | SN 74164 (pp. 334-338) |
| 44 | First Inverse Converter (Fixed Length) | Fairchild Isoplanar Schottky TTL Memory 93446 (of Ref. 1) |
| 46 | Second Inverse Converter (Variable Length) | |
| 48 | Selector | SN 74157 (pp. 318-322 of Reference 2) |
| 52 | Buffer Memory | BM (FIG. 1, page 1176, of Reference 3) |
| 54 | Code Boundary | Fairchild Isoplanar Schottky TTL Memory 93446 (of Ref. 1) |
| 56 | Decision-Making Circuit | |
| 58 | Register | SN 7474 (page 76 of Ref. 2) |
| 60 | Detection | SN 74133 (page 84 of Ref. 2) |
| 62 | Gate | SN 7432 (page 69 of Ref. 2) |
| 64 | Code Length Detector | Fairchild Isoplanar Schottky TTL Memory 93446 (of Ref. 1) |
| 76 | Counter | SN 74191 (pp. 417-426 of Reference 2) |
| 78 | Register | SN 74174 (pp. 363-368 of Reference 2) |
| 80 | Register | SN 7474 (page 76 of Reference 2) |
| 82 | Inverter | SN 7404 (page 63 of Reference 2) |
| 86 | Gate | SN 7408 (page 64 of Reference 2) |
| 103 | Subtractor | SN 74283 (pp. 7-415 to 70419 of Ref. 4) |
| 104 | P/S Converter | SN 74166 (pp. 7-217 to 7-221 of Ref. 4) |
| 105, 107, 112 | Register | SN 7474 (pp. 5-22 of Ref. 4) |
| 106, 108, 111 | NAND Gate | SN 7400 (pp. 5-6 of Ref. 4) |
| 109 | Counter | SN 74163 (pp. 7-195 to 205 of Ref. 4) |

Reference 4: "The Bipolar Digital Integrated Circuits Data Book for Design Engineers," published from Texas Instruments Incorporated, in 1976.

As has been mentioned above, the present invention greatly contributes to the band compression of digital signals in various communications systems. Those who, are skilled in the act will perceive other modifications. Therefore, the appended claims are to be construed broadly enough to cover all equivalent structures.

The claimed invention is:

1. A code converting system for band compression of digital signals including a code converter and a code-inverse converter, wherein:

said code converter comprises:

an input terminal for receiving an N-bit parallel input digital signal, first converting means coupled to said input terminal for converting said input digital signal into a fixed length code selected from $2^N$ kinds of fixed length codes and corresponding to the signal level of said input digital signal, second converting means coupled to said input terminal for converting said input digital signal to a variable length code selected from $2^N$ kinds of variable length codes and corresponding to the signal level of said input digital signal, first selector means coupled to the outputs of said first converting means and said second converting means for selectively passing the output of one of said converting means, first buffer memory means for storing the code supplied from said first selector and for transmitting the stored code in series and at a constant speed to a transmission channel, first decision making circuit means coupled to said input terminal for deciding whether said input digital signal has a signal level corresponding to a first predetermined variable length code or whether said input digital signal has the signal level corresponding to a second predetermined variable length code, said decision making circuit means causing said first selector means to select between said converting means responsive to the decision which is made by the decision making circuit means, first register means coupled to said first decision making circuit means for storing the output signal from said first decision making circuit means and for delaying said output signal by one sample period in order to form a delayed output signal which is supplied to said first selector;

said code-inverse converter comprises:

serial-to-parallel converter means for converting an output code transmitted from said code converter into a parallel code, first inverse-converting means coupled to said serial-to-parallel converter means for inversely-converting the fixed length code given from said serial-to-parallel converter means into an input digital signal corresponding to said fixed length code, second inverse-converting means coupled to said serial-to-parallel converter means for inverse-converting the variable length code given from said serial-to- parallel converter means into an input digital signal corresponding to said variable length code, code-boundary detecting means coupled to said serial-to-parallel converter means for detecting the boundary between codes in said output code given from said code converter, second decision making circuit means coupled to said serial-to-parallel converter means for deciding whether said output code from said serial-to-parallel converter means is a fixed length code or a variable length code, second register means coupled to said second decision making circuit means for storing the output signal from said second decision making circuit means and for delaying said output signal by one sample period, second selector means coupled to the outputs of said first inverse-converting means and said second inverse-converting means, said second selector being operated in response to an output signal means from said second register means, and second buffer memory means connected to said second selector means for storing an output digital signal selected by said second selector in response to an output signal from said code-boundary detecting means and for reading out the resulting stored digital signal at a constant speed.

2. A code converting system for band compression of digital signals as claimed in claim 1, wherein said first converting means and said first inverse converting means comprise read only memories, respectively.

3. A code converting system for band compression of digital signals as claimed in claim 1, wherein said first converting means and said first inverse-converting means comprise a plurality of signal wires, respectively.

* * * * *